United States Patent
Aldebert et al.

(10) Patent No.: US 6,789,234 B2
(45) Date of Patent: Sep. 7, 2004

(54) METHOD AND SYSTEM FOR A TIMING BASED LOGIC ENTRY

(75) Inventors: Jean-Paul Aldebert, Vence (FR); Jean Calvignac, Cary, NC (US); Fabrice Verplanken, La Gaude (FR)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/328,355

(22) Filed: Dec. 23, 2002

(65) Prior Publication Data

US 2003/0126565 A1 Jul. 3, 2003

(30) Foreign Application Priority Data

Dec. 28, 2001 (EP) ............................................. 01480152
Dec. 28, 2001 (EP) ............................................. 01480153

(51) Int. Cl.$^7$ ........................... G06F 17/50; G06F 9/45; G01R 31/28
(52) U.S. Cl. ..................... 716/3; 716/4; 716/6; 714/6
(58) Field of Search ............................... 716/1, 3, 4, 6, 716/11, 18; 712/21.3; 711/157; 710/35; 708/523; 703/1, 14, 15; 702/118; 700/17; 382/293; 375/219; 363/60; 345/620, 440, 418; 326/96

(56) References Cited

U.S. PATENT DOCUMENTS

| | | | |
|---|---|---|---|
| 5,111,413 A | * 5/1992 | Lazansky et al. | ............. 703/14 |
| 5,371,851 A | * 12/1994 | Pieper et al. | ................ 345/501 |
| 5,381,524 A | * 1/1995 | Lewis et al. | ................ 345/804 |
| 5,455,898 A | * 10/1995 | Mahoney et al. | ........... 715/527 |
| 5,491,815 A | 2/1996 | Basso et al. | |
| 5,600,567 A | 2/1997 | Kucukcakar et al. | |
| 5,794,033 A | 8/1998 | Aldebert et al. | |
| 5,923,664 A | 7/1999 | Aldebert et al. | |
| 6,110,223 A | 8/2000 | Southgate et al. | |
| 6,122,442 A | * 9/2000 | Purcell et al. | .............. 345/620 |
| 6,144,933 A | 11/2000 | Guccione | |
| 6,161,211 A | * 12/2000 | Southgate | ...................... 716/1 |
| 6,181,320 B1 | * 1/2001 | Fredrickson | ................. 345/440 |
| 6,360,356 B1 | * 3/2002 | Eng | ............................ 716/18 |
| 6,453,450 B1 | * 9/2002 | Walter | ........................... 716/6 |
| 6,470,482 B1 | * 10/2002 | Rostoker et al. | ............... 716/6 |
| 6,546,526 B2 | * 4/2003 | Lai et al. | ....................... 716/4 |
| 6,588,004 B1 | * 7/2003 | Southgate et al. | ............ 716/11 |
| 6,598,057 B1 | 7/2003 | Synnestvedt et al. | |
| 6,657,962 B1 | 12/2003 | Barri et al. | |

OTHER PUBLICATIONS

Moeschler et al., "High–level modeling using exended timing diagrams—A formalism for the behavioral specification of digital hardware", Sep. 20–24, 1993, Design Automation Conference, 1993, with EURO–VHDL '93. pp.: 494–499.*

* cited by examiner

*Primary Examiner*—R. M. Thompson
*Assistant Examiner*—Helen Rossoshek
(74) *Attorney, Agent, or Firm*—Joseph P. Abate

(57) ABSTRACT

A method and system for creating on a computer a timing based representation of an integrated circuit using a graphical editor operating on the computer. The method includes first in creating timing diagrams identifying the elements of the circuit and their time based interconnections. The method further comprises a translation of the timing based diagram editor files into HDL statement. The preferred embodiment is described, it comprises the use of an ASCII editor and a translation program to VHDL statements. A system is also described implementing the steps of the method in a computer. In order to avoid having different tools to translate timing based diagram editor files into HDL statements, a first step translating graphical editor output file into a PostScript file is performed by executing the "print to file" command of the printing driver of the computer. The PostScript file is then translated into a bitmap file using a RIP. The translation is then performed from the bitmap file into the HDL statements. This translation is "universal" as it can be used for any type of initial graphical file containing the timing diagram.

10 Claims, 11 Drawing Sheets

```
library IEEE;
use IEEE.STD_LOGIC_1164.ALL;
use IEEE.STD_LOGIC_ARITH.ALL;
use IEEE.STD_LOGIC_UNSIGNED.ALL;

entity Example is
Port (
    Clock:  ~100         in std_logic;
    Inp1:   ~110         in  std_logic_vector(7 downto 0);
    Reg3:   ~150         out std_logic_vector(7 downto 0);
    Reg4:   ~170         out std_logic;
    );
end     Example;

architecture arch_Example of Example is signal Reg1 :   ~120    std_logic_vector(7 downto 0);
    signal Reg2 :   ~130    std_logic_vector(7 downto 0);
    signal Comb1 :  ~140    std_logic_vector(7 downto 0);
    signal Comb2 :  ~160    std_logic;

begin
                                    145
    Comb1       <= Reg2 + 1;  ~
    Comb2       <= Comb1(7) ~175
                xor Comb1(6)
                xor Comb1(5)
                xor Comb1(4)
                xor Comb1(3)
```

FIG. 3A

```
                xor Comb1(2)
                xor Comb1(1)
                xor Comb1(0);

process (CLK) begin
        if    (CLK'event and CLK='1')   ⟋105
        then Reg1         <= Inp1;  ⟋115
        end if;

process (CLK) begin
        if    (CLK'event and CLK='1')   ⟋105
        then Reg2         <= Reg1;  ⟋125
        end if;

process (CLK) begin
        if    (CLK'event and CLK='1')   ⟋105
        then Reg3         <= Comb1;  ⟋155
        end if;

process (CLK) begin
        if    (CLK'event and CLK='1')   ⟋105
        then Reg4         <= Comb2;  ⟋185
        end if;

end process;

end arch_Example;
```

FIG. 3B

| DEC. | HEX | EBCDIC | ASCII | DEC. | HEX | EBCDIC | ASCII | DEC. | HEX | EBCDIC(1) | ASCII | DEC. | HEX | EBCDIC(1) | ASCII |
|---|---|---|---|---|---|---|---|---|---|---|---|---|---|---|---|
| 0 | 00 | NUL | NUL | 40 | 28 | SA | { | 64 | 40 | SP | SP | 104 | 68 | | h |
| 1 | 01 | SOH | SOH | 41 | 29 | SFE | } | 65 | 41 | RSP | A | 105 | 69 | | i |
| 2 | 02 | STX | STX | 42 | 2A | SM/SW | * | 66 | 42 | | B | 106 | 6A | : | j |
| 3 | 03 | ETX | ETX | 43 | 2B | CSP | + | 67 | 43 | | C | 107 | 6B | . | k |
| 4 | 04 | SEL | EOT | 44 | 2C | MFA | , | 68 | 44 | | D | 108 | 6C | % | % | l |
| 5 | 05 | HT | ENQ | 45 | 2D | END | - | 69 | 45 | | E | 109 | 6D | _ | _ | m |
| 6 | 06 | HNL | ACK | 46 | 2E | ACK | . | 70 | 46 | | F | 110 | 6E | > | > | n |
| 7 | 07 | DEL | BEL | 47 | 2F | BEL | / | 71 | 47 | | G | 111 | 6F | ? | ? | o |
| 8 | 08 | GE | BS | 48 | 30 | | 0 | 72 | 48 | | H | 112 | 70 | | p |
| 9 | 09 | SPS | HT | 49 | 31 | | 1 | 73 | 49 | | I | 113 | 71 | | q |
| 10 | 0A | RPT | LF | 50 | 32 | SYN | 2 | 74 | 4A | c | c | J | 114 | 72 | r |
| 11 | 0B | VT | VT | 51 | 33 | IR | 3 | 75 | 4B | . | . | K | 115 | 73 | s |
| 12 | 0C | FF | FF | 52 | 34 | PP | 4 | 76 | 4C | < | < | L | 116 | 74 | t |
| 13 | 0D | CR | CR | 53 | 35 | TAN | 5 | 77 | 4D | ( | ( | M | 117 | 75 | u |
| 14 | 0E | SO | SO | 54 | 36 | NBS | 6 | 78 | 4E | + | + | N | 118 | 76 | v |
| 15 | 0F | SI | SI | 55 | 37 | EOT | 7 | 79 | 4F | | | | O | 119 | 77 | w |
| 16 | 10 | DLE | DLE | 56 | 38 | SBS | 8 | 80 | 50 | & | & | P | 120 | 78 | x |
| 17 | 11 | DC1 | DC1 | 57 | 39 | IT | 9 | 81 | 51 | | Q | 121 | 79 | | y |
| 18 | 12 | DC2 | DC2 | 58 | 3A | RFF | : | 82 | 52 | | R | 122 | 7A | : | : | z |
| 19 | 13 | DC3 | DC3 | 59 | 3B | CU3 | ; | 83 | 53 | | S | 123 | 7B | # | # | { |
| 20 | 14 | RES/ENP | DC4 | 60 | 3C | DC4 | < | 84 | 54 | | T | 124 | 7C | @ | @ | \| |
| 21 | 15 | NL | NAK | 61 | 3D | NAK | = | 85 | 55 | | U | 125 | 7D | ' | ' | } |
| 22 | 16 | BS | SYN | 62 | 3E | | > | 86 | 56 | | V | 126 | 7E | = | = | ~ |
| 23 | 17 | POC | ETB | 63 | 3F | SUB | ? | 87 | 57 | | W | 127 | 7F | " | " | DEL |
| 24 | 18 | CAN | CAN | | | | | 88 | 58 | | X | 128 | 80 | | |
| 25 | 19 | EM | EM | | | | | 89 | 59 | | Y | 129 | 81 | a | a |
| 26 | 1A | UBS | SUB | | | | | 90 | 5A | ! | ! | Z | 130 | 82 | b | b |
| 27 | 1B | CU1 | ESC | | | | | 91 | 5B | $ | $ | [ | 131 | 83 | c | c |
| 28 | 1C | IFS | FS | | | | | 92 | 5C | * | * | \ | 132 | 84 | d | d |
| 29 | 1D | IGS | GS | | | | | 93 | 5D | ) | ) | ] | 133 | 85 | e | e |
| 30 | 1E | IRS | RS | | | | | 94 | 5E | ; | ; | ^ | 134 | 86 | f | f |
| 31 | 1F | ITB/IUS | US | | | | | 95 | 5F | ¬ | ¬ | _ | 135 | 87 | g | g |
| 32 | 20 | DS | SP | | | | | 96 | 60 | - | - | ` | 136 | 88 | h | h |
| 33 | 21 | SOS | ! | | | | | 97 | 61 | / | / | a | 137 | 89 | i | i |
| 34 | 22 | FS | " | | | | | 98 | 62 | | b | 138 | 8A | | |
| 35 | 23 | WUS | # | | | | | 99 | 63 | | c | 139 | 8B | | |
| 36 | 24 | BYP/INP | $ | | | | | 100 | 64 | | d | 140 | 8C | ≤ | |
| 37 | 25 | LF | % | | | | | 101 | 65 | | e | 141 | 8D | { | |
| 38 | 26 | ETB | & | | | | | 102 | 66 | | f | 142 | 8E | * | |
| 39 | 27 | ESC | ' | | | | | 103 | 67 | | g | 143 | 8F | + | |

FIG. 9A

| DEC. | HEX | EBCDIC(1) | ASCII | DEC. | HEX | EBCDIC(1) | ASCII |
|---|---|---|---|---|---|---|---|
| 144 | 90 | | | 184 | B8 | | 8 |
| 145 | 91 | j | j | 185 | B9 | | 9 |
| 146 | 92 | k | k | 186 | BA | | |
| 147 | 93 | l | l | 187 | BB | | ⌋ |
| 148 | 94 | m | m | 188 | BC | | ⌐ |
| 149 | 95 | n | n | 189 | BD | | % |
| 150 | 96 | o | o | 190 | BE | | # |
| 151 | 97 | p | p | 191 | BF | | _ |
| 152 | 98 | q | q | | | | |
| 153 | 99 | r | r | | | | |
| 154 | 9A | | | | | | |
| 155 | 9B | | ) | | | | |
| 156 | 9C | | XX | | | | |
| 157 | 9D | | ' | | | | |
| 158 | 9E | | * | | | | |
| 159 | 9F | | # | | | | |
| 160 | A0 | | | | | | |
| 161 | A1 | - | - | | | | |
| 162 | A2 | s | s | | | | |
| 163 | A3 | t | t | | | | |
| 164 | A4 | u | u | | | | |
| 165 | A5 | v | v | | | | |
| 166 | A6 | w | w | | | | |
| 167 | A7 | x | x | | | | |
| 168 | A8 | y | y | | | | |
| 169 | A9 | z | z | | | | |
| 170 | AA | | | | | | |
| 171 | AB | | ∟ | | | | |
| 172 | AC | | ⌐ | | | | |
| 173 | AD | | | | | | |
| 174 | AE | | ≥ | | | | |
| 175 | AF | | * | | | | |
| 176 | B0 | | 0 | | | | |
| 177 | B1 | | 1 | | | | |
| 178 | B2 | | 2 | | | | |
| 179 | B3 | | 3 | | | | |
| 180 | B4 | | 4 | | | | |
| 181 | B5 | | 5 | | | | |
| 182 | B6 | | 6 | | | | |
| 183 | B7 | | 7 | | | | |

FIG. 9B

METHOD AND SYSTEM FOR A TIMING BASED LOGIC ENTRY

FIELD OF THE INVENTION

The present invention relates generally to design of integrated circuit and more particularly the present invention defines a method and system for new logic entry.

BACKGROUND OF THE INVENTION

The logic design is the first phase of the hardware development process of an integrated circuit. The logic design describes the functions that the integrated circuit will execute. The logic design describes the set of elements related together with the data flows which will all contribute to the execution of the functions. To design integrated circuits for ASICs (Application Specific Integrated Circuits) or FPGAs (Field Programmable Gate Array) or any dedicated integrated circuits such as processors, basic hardware elements are combined in the chip. These hardware elements, the gates, form a basic set comprising Read/Write memories and registers to store and modify data, or signal and buses to convey data from one element to one other etc. The logic design describes how a global function of the circuit is realized by combining basic elements. The logic design step must also produce an 'entry' to the following hardware development phases. As a matter of fact, the hardware development process is computerized and standardized. In the language based design automation process, the first phase consists in describing the logic, for instance with a High level Description Language (HDL) which are high level programming languages such as VHDL, Verilog or AHDL. The programs are then compiled and the following phases start from the execution of these compiled programs for performing further simulation or synthesis for the creation of netlists.

The VHDL programs include the algorithmic description of the functions, they describe the behavior of the logic. This is a way to enter the logic by defining 'what it does'.

One other way to enter the logic is to describe the structure of the logic. The existing methods involve a graphical description of the logic circuit This is a way to enter the logic by defining 'what it is'. The Computer Aided Drawing tools are graphical, they allow the designer to create, through the graphical user interface of the computer, block diagrams which illustrate the designer thoughts as for the high-level architecture of the circuit and the functions of the logic. Such tools allow also, then, to represent the architecture in terms of basic elements. One such design graphical editor is described in the U.S. Pat. No. 6,110,223. This editor allows the designer to organize his thoughts as to the high-level architecture and functionalities of the logic. Also the editor provides output VHDL libraries usable for the following computerized and standardized phases of the hardware development process.

Furthermore, the two methods can be combined in some way, for example, by describing graphically the logic as interconnected blocks, each block calling a behavioral description of its internal logic.

However, none of these methods include an explicit and intuitive notion of time, and more particularly do not provide any indication of the behavior of the logic in time. In electronic industry, timing in hardware components a fundamental constraint as, depending on the technology used, performing a function in a basic component takes a defined and invariable amount of time. One major challenge in designing a logic is to have the functions performed and synchronized in a time which may correspond to the data flow speed in input and the data flow speed expected in output of a function implemented as an integrated circuit. Clocks are hardware signals used for sequencing the data flow between all the components of an integrated circuit. Consequently, during the phase of logic design, the functions are split into basic elements while respecting the timing for synchronizing the execution of all of them. In the following phases of development such as the simulation after compilation of the logic design or later when the integrated circuit is tested during the bringup phase, for performing the logic verification, the functions are checked against the timing. At these steps a logic can be rejected because of unrealistic timing for execution of functions. One editor used to test the validity of timing for the scheduling of functions in a design is described in the U.S. Pat. No. 5,600,567. This editor provides a visual and scheduling criteria assigned to an algorithmic description of a function.

It is noted also that logic designers refer virtually always to some timing diagrams when creating logic circuits, whether they are in actual design documentation, or just as mental representation of what actions are triggered by their logic in time. User of logic circuits or elements invariably find in the data book describing them, some timings representing the behavior in time of some parts of the element.

There is a need to give to the designers a tool for designing a logic while taking into account its timing behavior.

The tool should take into account the two ways to design logic today which are either writing the algorithm in a HDL programming language or drawing with a graphical editor to have a comprehensible representation of the hardware elements.

As the designers may use different graphical editors to create a graphical representation of a logic design, the method to create a timing based logic entry should be adapted to any graphical editor. The method should be also stable enough to avoid having to change it each time a new version of a graphical editor is made available by the software manufacturer.

OBJECTS OF THE INVENTION

It is thus an object of the present invention to provide a method for logic entry taking into account the timing constraints of the design.

A second object of the invention is to have a computer based method using a graphical representation of the timing based logic entry.

It is a third object of the present invention to provide a computer based method for creating graphical logic design taking into account the timing constraints.

A fourth object of the invention is to create, starting from a graphical timing based logic design, the corresponding statements describing the logic in High level Design Language.

A fifth object of the invention is to have a method adapted to the use of any kind of computer graphical editor.

SUMMARY OF THE INVENTION

These objects are reached with a method for creating on a computer a timing based representation of an integrated circuit using a graphical editor operating on the computer, said method comprising the steps of:

drawing with a single line at least one time line representing the at least one clock of the circuit;

drawing other bit signal time lines;

drawing direct arrows going from one of the drawn signal time line to at least one other drawn signal time line to describe the signal assignments of the circuit;

drawing function symbols and writing function names identifying the functions of the circuit;

drawing arrows connecting signals through functions symbols for conditional signal assignments; and, writing signal names.

Alternatively, the method also further comprises the steps of:

reading the graphical editor output file;

identifying the signal names;

identifying the direct arrows and the signals of the signal assignments;

identifying the functions, the arrows and the signals of the conditional signal assignments;

identifying the input and output signals of the circuit;

creating an HDL file and writing the HDL statements corresponding to the elements and behavior identified in the previous identifying steps.

Alternatively, the method also further comprises the following steps of:

identifying in the graphical editor output file function names corresponding to predefined functions;

looking for HDL statements of said predefined functions in a library of predefined function HDL files;

inserting in the created HDL file the HDL statements read in the said predefined function HDL files.

Additionally, these objects are reached with a method for creating on a computer a timing based representation of an integrated circuit using a graphical editor operating on the computer, said method comprising the steps of:

drawing with a single line at least one time line representing the at least one clock of the circuit;

drawing other bit signal time lines;

drawing direct arrows going from one of the drawn signal time line to at least one other drawn signal time line to describe the signal assignments of the circuit;

drawing function symbols and writing function names identifying the functions of the circuit;

drawing arrows connecting signals through functions symbols for conditional signal assignments; and, writing signal names;

translating the graphical editor output file into a PostScript format file;

translating the PostScript format file into a bitmap file;

reading the bitmap file;

identifying the signal names;

identifying the direct arrows and the signals of the signal assignments;

identifying the functions, the arrows and the signals of the conditional signal assignments;

identifying the input and output signals of the circuit;

creating an HDL file and writing the HDL statements corresponding to the elements and behavior identified in the previous identifying steps.

Alternatively, the method also further comprises the following steps of:

identifying in the graphical editor output file function names corresponding to predefined functions;

looking for HDL statements of said predefined functions in a library of predefined function HDL files;

inserting in the created HDL file the HDL statements read in the said predefined function HDL files.

The objects are also achieved with the use of a computer program product comprising programming code instructions for executing the steps of the method when said program is executed on a computer.

The objects are also achieved with the use of a system adapted for carrying out the method.

A primary advantage of the invention is to have a timing representation of the behavior of the logic in consistence with the use of timing during the phase of testing, simulation and documentation used in the following phases of the hardware development process.

Additionally, this method leads to simplified verification activities because the information used to describe the logic are the same information that can be used to check the correctness of operation of a simulated circuit in the following steps of hardware development process.

Furthermore, to be open to optimized design processes, it is possible to use classical logic entry methods on some parts of a circuit and to use the timing based logic entry on the other parts. This can be required to reuse existing blocks already described in HDL, while using timing based logic entry for the design of blocks such as interfaces, clock circuits, data flow description etc . . . Such mixed design entry is possible by the method of the present invention which translates a timing diagram into a logic described in HDL, thereby enabling the interconnection with HDL based circuits.

As the format timing diagram graphical file is modified by two successive translations into a PostScript format then a bitmap file, the final steps of the method for translating from a bitmap file to a HDL description file can be "universally" used. As a matter of fact, the PostScript or bitmap format software programs are widely used and very stable with the printing software providers. Furthermore, if a graphical editor provides a new version, the PostScript translation will be always updated by the graphical editor manufacturers who accomodate the device driver provided with the operating system. Consequently, once written, the bitmap to HDL format translation method of the invention is widely used for any hardware graphical design environment and stable because there will be no change in the bitmap definition.

BRIEF DESCRIPTION OF THE DRAWINGS

FIG. 3. illustrates the design of the same logic circuit of FIG. 1 as translated into a source program written in the VHDL High level Description Language of the prior art.

FIG. 9 is a code table where one can read the ASCII characters and their codes in decimal.

DETAILED DESCRIPTION OF THE INVENTION

Figure 1:
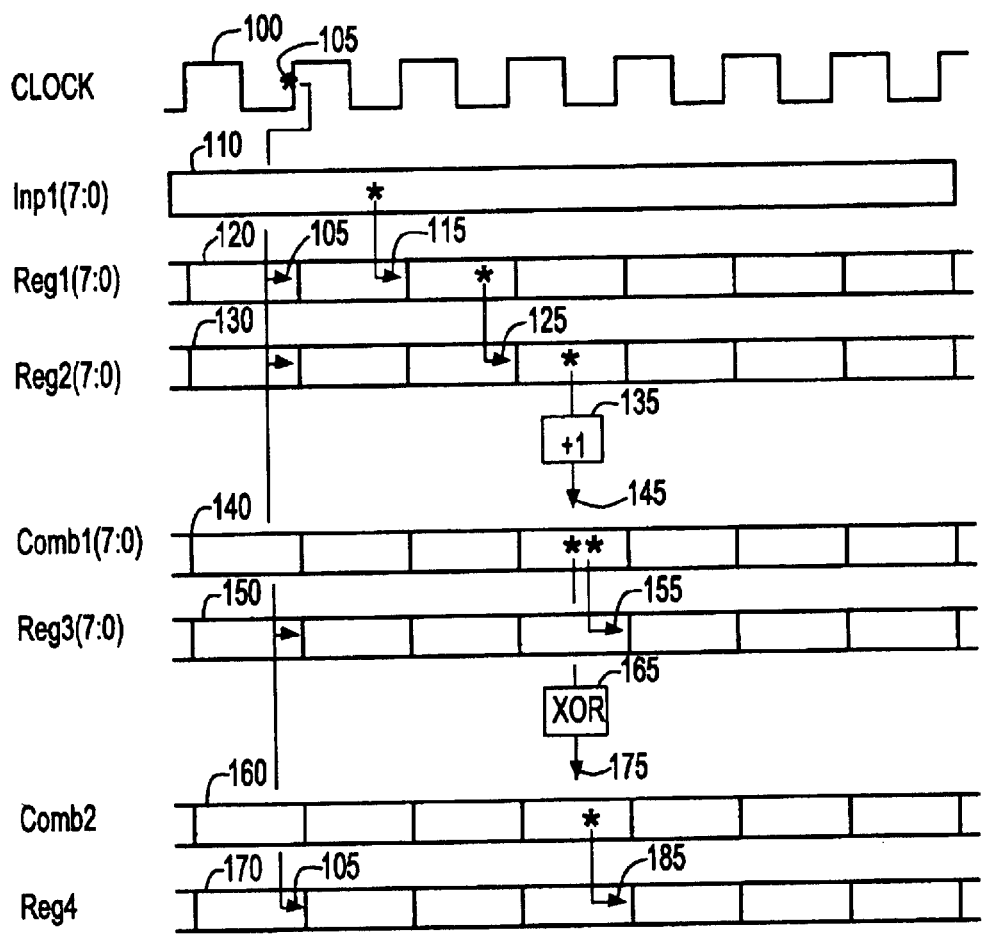
FIG. 1 illustrates a logic circuit design created with a timing based logic entry according to the preferred embodiment.

FIG. 1 is a graphical view of a logic circuit design created with the method of the preferred embodiment. The circuit design is displayed on the screen of a computer, stored in a text file or printed. In this graphical view is illustrated the behavior of logic signals in time through graphical timing lines. Timing lines represent states of the signals in time and arrows represent interactions between signals. Each signal name is identified at the left of the timing line. It is noted that the signal names correspond to the hardware element names. As a matter of fact, in timing diagrams one rather consider the timing line of the signal driven by the hardware element. For instance "Reg1" signal is the signal driven by the hardware register 1. There are either bus signals which are multiple bit signals, or single bit signals such as the clock signal. One clock signal, at least, is always part of a timing diagram.

"Reg1" (120), "Reg2" (130), "Reg3" (150) and "Reg4" (170) are registers clocked by rising edges (105) of "Clock" (100) as shown by the multiple arrows.

"Reg1" is a 8-bit register which receives data from "Input" (110), the input of the circuit, as shown by the second arrow (115). This arrow (115) ends at the beginning of the next cycle of "Reg2", clearly illustrating the clocked nature of the data transfer.

"Reg2" receives the data from "Reg1" s shown with the third arrow (125).

"Comb1" is the 8-bit output of a combinational circuit implementing an incrementation. This function is illustrated by a rectangle comprising the "+1" operation. "Comb1" receives "Reg2" as an input, indicated by the fourth arrow (145). The position of this fourth arrow and of the function rectangle in the same clock cycle shows the combinational (not clocked) nature of the function.

"Comb1" signal is used as an input to the 8-bit register "Reg3", as shown by the fifth arrow (155).

"Comb2" is the single bit output of the a combinational circuit implementing parity calculation. This function is shown by the XOR rectangle (165) receiving "Comb1" as an input indicated by the sixth arrow (175).

"Reg4" is a single bit latch reclocking "Comb2" signal, as indicated with the seventh arrow (185).

The combinational functions can be either a simple function such as "XOR" or a predefined combinational function such as "CRC32" which is the Cyclic Redundancy Check calculation for generator polynomials of degree 32. In the timing diagram representation one can represent a predefined combinational function in a rectangle is the same way than for the rectangles (135, 165) used for simple function representation.

The timing diagram of FIG. 1 has been created using the graphical editors operating with operating systems using the available graphical user interface. For instance, any ASCII editor, Lotus Freelance graphical editor, operating on top of Microsoft Windows. Other graphical editors which can be used are Microsoft Power Point or iGraph Designer both operating also on top of Microsoft Windows.

If Lotus Freelance is used, the symbols used for timing diagrams are drawn using the 'Drawing and Text' option. Under this option, the 'tool' proposes to draw lines for timing lines, rectangle for combinational functions, arrows, polylines and to add text anywhere in the drawing. The man skilled in the art could use many other symbols (polygons, curves etc . . . ) to build timing diagram which are available with a graphical language as sophisticated as Lotus Freelance. In the preferred embodiment a minimum and simple set of symbol has been defined to draw timing diagrams in order to fit with a maximum of graphical tools, even basic. With this set of symbols, any logic can be drawn as shown in reference with FIG. 4, FIG. 5 and FIG. 6 described later in the document, which respectively illustrate with the minimum set of symbols just described in reference to FIG. 1, a synchronous memory, a asynchronous memory and the operator.

Figure 2:
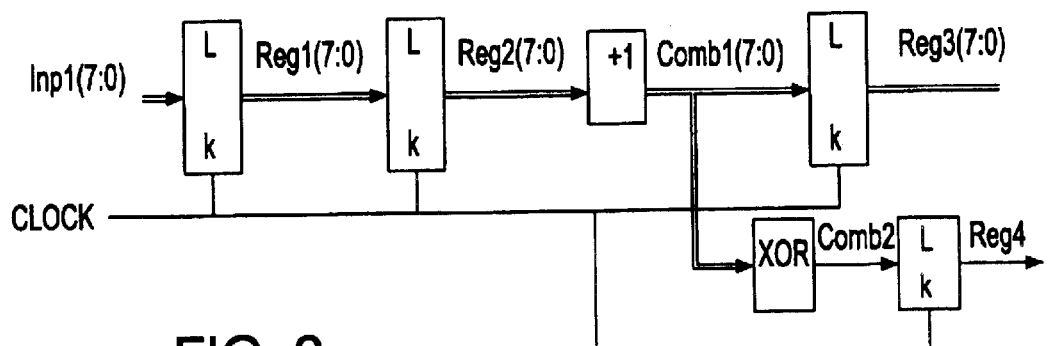
FIG. 2 illustrates the design of the same logic circuit of FIG. 1 as translated into a graphical structural logic entry of the prior art.

FIG. 2 illustrates the result of a possible embodiment of the method of the present invention. FIG. 2 shows the result of the translation of the graphical file containing timing diagram of FIG. 1 into one other graphical file containing the representation of the logic structure of the same designed object. As the two representations are graphical, the same graphical editor can be used. For instance, the ".PRZ" freelance file representing the timing diagram of FIG. 1 will be translated into one other ".PRZ" file. Each timing symbol such as clocked bus timing lines, clock lines, combinational rectangles, direct arrow or arrow to a following cycle can be translated into a graphical logic blocks. The vertical arrows of the timing diagram which are the connectors between elements are translated into horizontal arrows illustrating the data flow between elements. The arrows are simple for one bit clocking and doubled for more than one bit buses. All the elements are represented by rectangles. Element names are indicated at the right side of each element. Bus names are indicated at their left side. The combinational functions have the name of the function indicated inside the rectangles (+1, XOR). With these structural diagram, the parallelism of operations is illustrated by the vertical superposition of the rectangles and their corresponding flow of data. The principle of such translation is illustrated in more details with the method of the preferred embodiment described in reference to FIG. 7. It is noted that for the preferred embodiment the Lotus Freelance editor is not used as being too much specific: the representation of graphical objects in ".PRZ" files must be understood to write the translation program. Also, for each graphical editor, a specific translation program must be written.

FIG. 3 illustrates the result of the preferred embodiment of the method of the present invention. FIG. 3 shows the result of the translation of the graphical file containing timing diagram of FIG. 1 into a HDL logic description file. As HDL is programming language, the HDL files are text files. In the preferred embodiment, the HDL is IEEE standardized VHDL. The VHDL description files have a standardized format, they are ".VHD" files. The description of FIG. 3 can be adapted by the person skilled in the art to any other HDL.

As illustrated in FIG. 3, the designed object in VHDL programming language is defined as an "Entity" statement. In the Entity the Interface described with the "port" statement, it comprises in this example two inputs, the elements "Clock" and "Input" and two outputs, the elements "Reg3" and "Reg4". They correspond in the timing diagram of FIG. 1 to the Clock (100), the input signal Inp1 (110), the "Reg3" Register signal (150) and the "Reg4" bit signal (170). Then, the architecture is described in the VHDL programming language with the "architecture" statement. The structural architecture comprises in this example, four signal declarations, "Reg1", "Reg2", "Comb1" and "Comb2". They respectively correspond in the timing diagram to the signals 120, 130, 140 and 160. The elements of behavior are the architecture behavioral description VHDL statements. Under the "begin" statement are then described the unconditional signal assignments and the conditional signal assignments. The unconditional assignments are always true in the architecture. They describe the combinational operations which do not depend on the clock signal, that are executed in the same clock cycle. "Comb1" conveys the result of the "+1" operation on 8 bits. It corresponds to the direct arrow 145 in the timing diagram of FIG. 1.

In the process, "Comb2" conveys the result of the "XOR" combinational function, corresponding to the parity bit of the previous result conveyed in "Comb1". This process corresponds to the direct arrow 175 of the timing diagram. The other four signal assignments are conditional. They depend on events, clock rising in this case. Each of them is described under the "process" statement, they all begin with an "if" statement and finish with an "end if" statement. The first clock based process is represented by the arrow 105 showing the rising edge of the Clock (100) and the arrow 115, illustrating the transfer of the data at the next rising edge of the clock. The second clock based process is represented by the arrow 105 showing the rising edge of the Clock (100) and the arrow 125, illustrating the transfer of the data at the next rising edge of the clock. The third clock based process is represented by the arrow 105 showing the rising edge of the Clock (100) and the arrow 155, illustrating the transfer of the data at the next rising edge of the clock. The fourth clocked based process is represented by the arrow 105 showing the rising edge of the Clock (100) and the arrow 185, illustrating the transfer of the data at the next rising edge of the clock.

Figure 7:
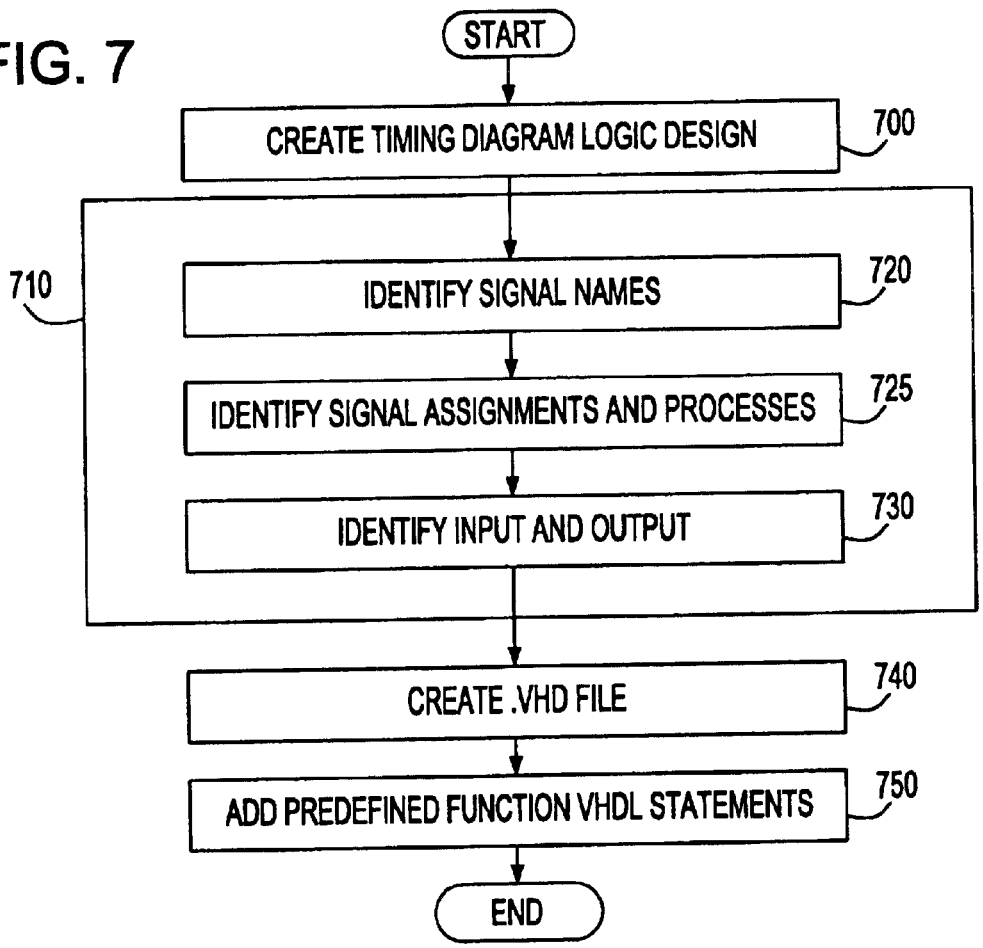
FIG. 7 is a flow chart of the method to create a timing diagram and to translate it into a VHDL file description according to the preferred embodiment.

FIG. 7 is the flow chart of the method according to the preferred embodiment for creating a timing diagram and for translating this timing diagram into a VHDL logic description file. The first step consists of creating a timing diagram using a graphical editor (700). In the preferred embodiment, a simple ASCII editor, as there are many under Microsoft Windows or DOS operating systems, is used instead of a more sophisticated graphical editor such as Lotus Freelance, to produce a graphical representation of the timing diagram. The interest of using an ASCII editor is that the output has a graphical display representation but is stored as ASCII files. The ASCII files are much easier to manipulated than a ".PRZ" file. One can try to interpret coding of graphical characters in a ".PRZ" file, but it is more complicated than with an ASCII file. An ASCII file consists of an unlimited number of lines having a fixed number of characters. Most often, lines have 255 characters. Each character being coded in ASCII code as illustrated in FIG. 9. For instance, according to the ASCII codes, "062" is the decimal value code for ">" representing the end point of an arrow in a timing diagram. The character "|" is coded in "179". This character is used to develop the vertical lines of the timing diagrams, the horizontal lines using the dash character "–" being coded in "196". The interest of such ASCII files is that they can be read as text by all the high level programming languages such as Pascal etc . . . This means that to perform a translation of a timing diagram coded as an ASCII file into a VHDL description file, one can write a program in Pascal reading the ASCII file by using the text representation of the ASCII characters ("|", ">" and "–") instead of their ASCII codes (respectively, "179", "062" and "196") in the read instructions of the translating program.

The following steps are for creating a ".VHD" file containing all the VHDL statements corresponding to the timing diagram which has been first created (700). There are three phases (710) in the translation for interpreting the ASCII coded character to recognize the VHDL elements which will be used to write the VHDL statements.

The first phase (720) of the translation is for identifying in the ASCII file all the signal names. This phase consists of reading each line and isolating the alphabetic character chain, if any, starting at the left edge of the line. For instance, when applied to the ASCII file of the timing diagram of FIG. 1, with this first pass, the following eight signal names will be identified: "Clock", "Inp1(7:0)", "Reg1(7:0)", "Reg2 (7:0)", "Comb1(7:0)", "Comb2", and "Reg4". These information will be later used in the following steps of the translation to identify the input and output signals of the object designed in the VHDL description file.

The second phase (725) of the translation is for identifying the signal assignments and the conditional processes of the designed object. It consists in rereading the ASCII file lines and looking for the symbol of the arrows: this is performed by reading each line and, each time the symbol for start of arrow is identified ("*" in the preferred embodiment as illustrated in FIG. 1 but any other specific symbol can be used), the characters for horizontal and/or vertical lines are looked for in the rest of the ASCII file, in order to fully identify the arrow. For each arrow fully identified, is known the starting point in a named signal and the arrival point(s) to the other signals. When discovering an arrow, the combinational functions found on the arrow are also identified. The combinational function is always defined in a rectangle ("+1" and "XOR" in FIG. 1). All these information will be later used in the following steps of the translation to signal assignments and the processes defining the behavioral statements of the VHDL description file.

The third phase (730) of the translation is for identifying the input and output signals signed object. It consists of rereading the ASCII file lines and looking for the signals never reached by an arrow: they are the non assigned signals and constitute the input signals of the designed object. This phase is also for identifying the signals being the end point of an arrow without any start point, these signals constitute the output signals of the designed object.

After these three first phases of translation, all the elements of the circuit have been identified. The following step consists in creating a ".VHD" description file and writing in it (740) the VHDL statements corresponding to the elements just identified in the translation (710). The input and output signals having been identified in the third translation phase are declared under the Port statements (as illustrated in FIG. 3). The behavioral architecture in then described. Under the "begin" statement are written the signal assignment statements. They correspond to direct arrows identified in the second phase of the translation which never include a combinational function. Then, the process statement are written in the VHDL description file. The process have been identified during the arrow discovery of the second phase.

The process correspond to the arrows including a combinational functions. This is converted into a process which is a conditional signal assignment as illustrated in FIG. 3.

The method can stop at this point when all the VHDL statements have been identified. This is the case of the example chosen in this description. One more step can be necessary if in the timing diagram, some predefined functions have been used. For instance, one function can be CRC32 and one statement process can be "if CRC32='1'". In this case, the VHDL statements corresponding to CRC32 computation will be added in this additional step (750). The step to add the statements for CRC32 computation will comprise looking for a VHDL member of a VHDL library called "CRC32" and to insert the corresponding VHDL statements everywhere it is necessary in the just created ".VHD" description file. This is a process well known in programming and even with VHDL.

Figure 8:
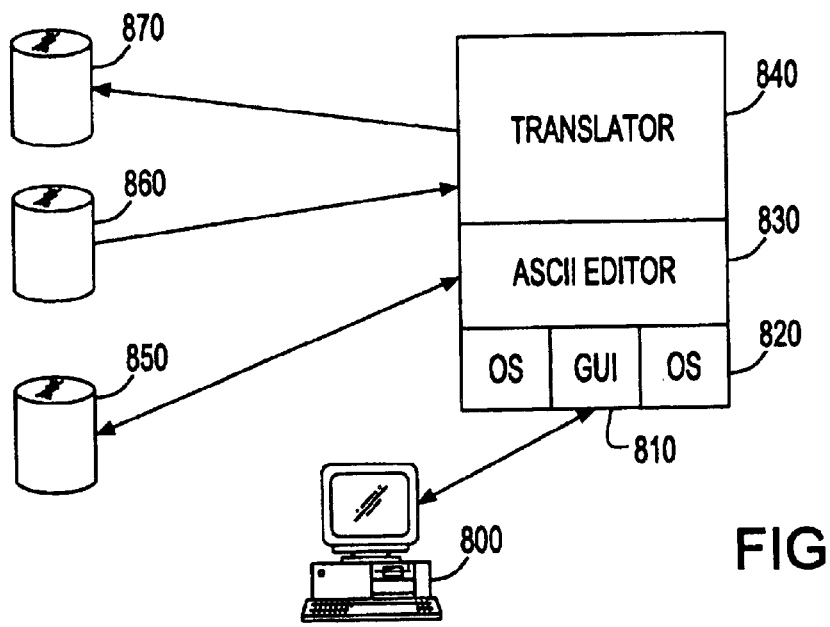
FIG. 8 describes the computing environment to operate the method of the preferred embodiment.

FIG. 8 shows the computer environment for operating the method of the preferred embodiment illustrated with the flow chart of FIG. 7. Loaded in the computer (800), the operating system (820) has a graphical user interface (GUI) (810). An ASCII editor (830) will use this GUI to interface with the designer. The designer displays graphical timing diagrams on the screen while conceiving the logic. The, translation of this ASCII file is then started as a program (840) executed on the computer. All these software layers are inside the memory of the computer (840, 830, 820). The result of the timing diagram logic entry is stored in an ASCII file (850). The translation starts with the three phases for identifying all the elements of the timing diagram and then the translation is done, a "VHD" description file is created (870) and filled with all the VHDL statements implementing the elements found in the translation phases as explained in reference with FIG. 7. During this step is created a VHDL description file.

Optionally, the computer environment may include a VHDL library (860) comprising ".VHD" description files corresponding to the predefined functions used in the design. The translator (840) looks for the ".VHD" files corresponding to the predefined functions and updates the just created ".VHD" file (870) wherever it is necessary.

Figure 4:
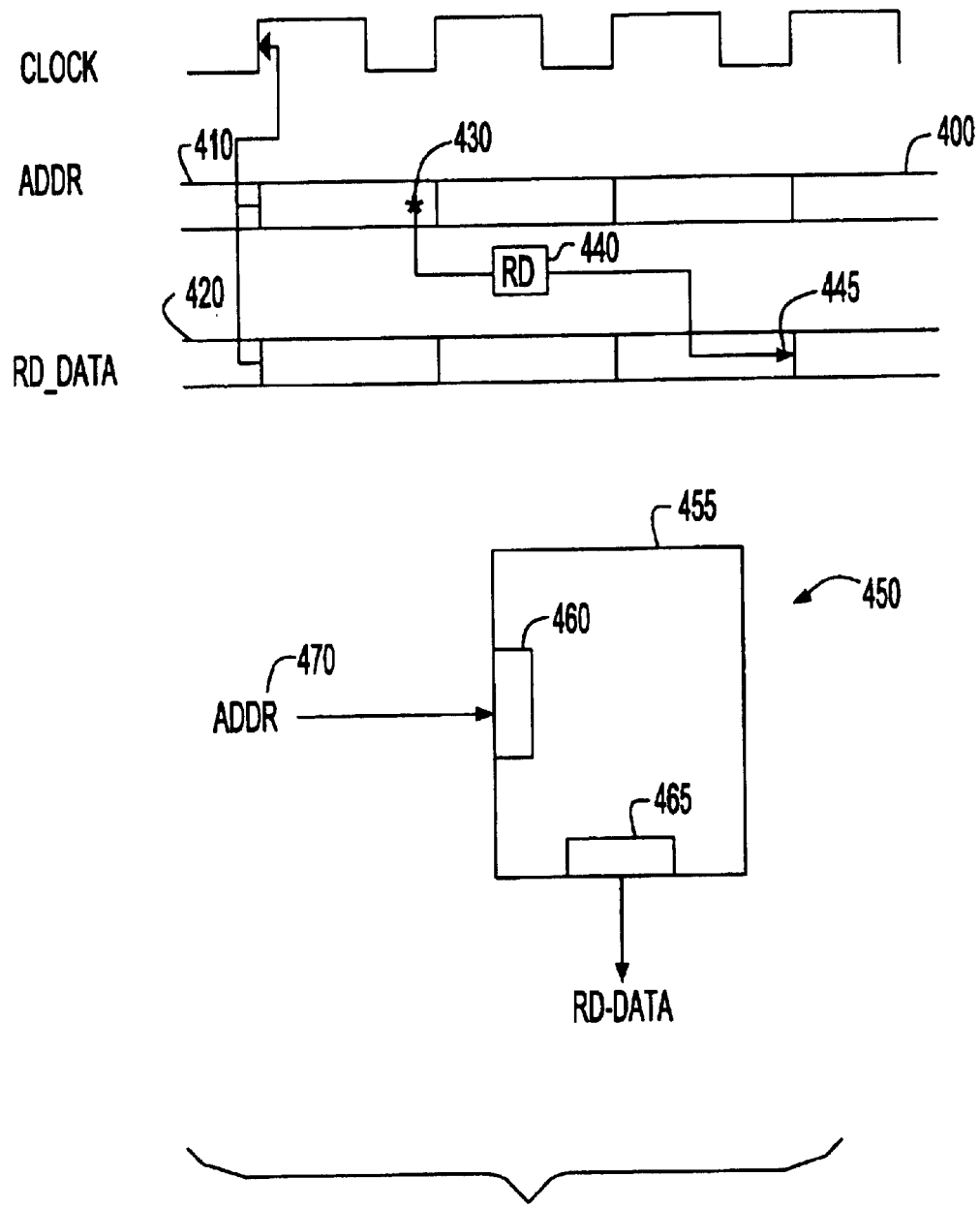
FIG. 4 illustrates the logic entry of a synchronous memory designed according to the method of the preferred embodiment.
Figure 5:
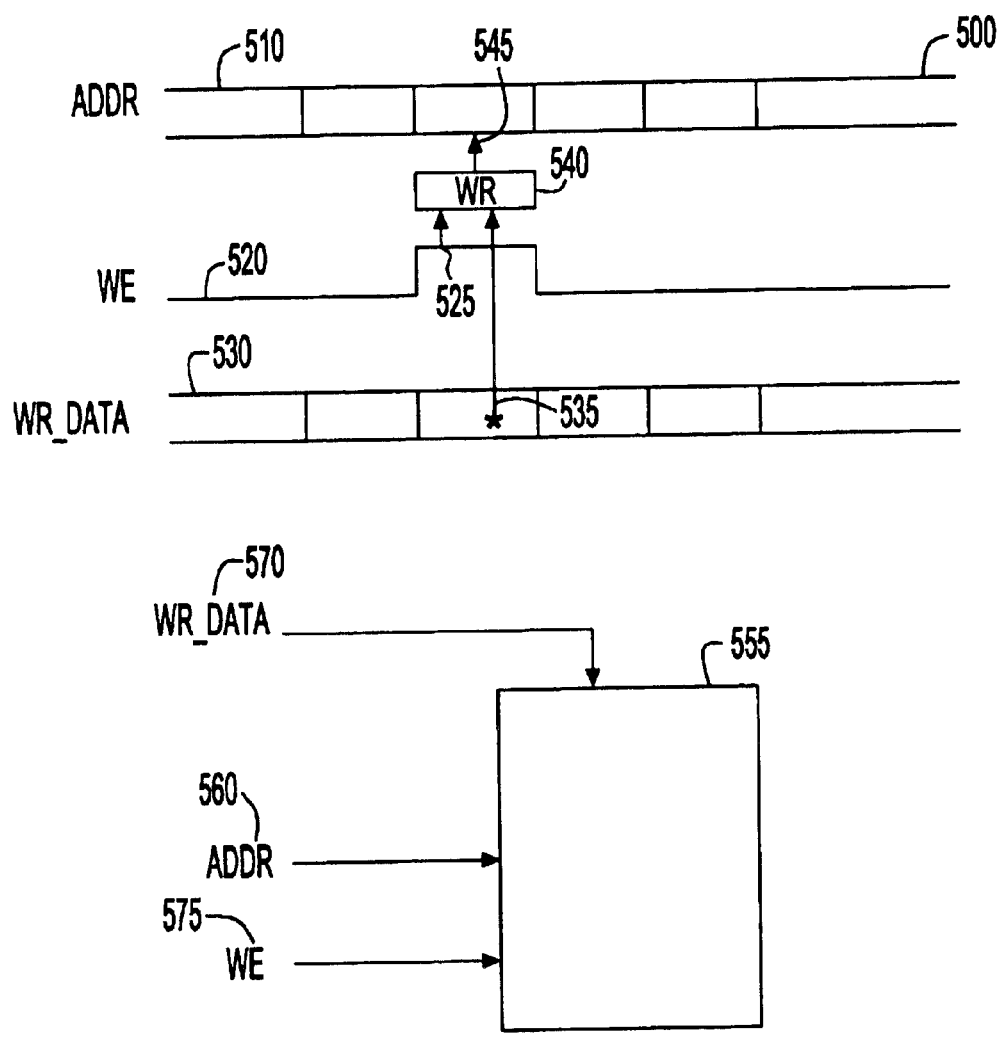
FIG. 5 illustrates the logic entry of a asynchronous memory designed according to the method of the preferred embodiment.
Figure 6:
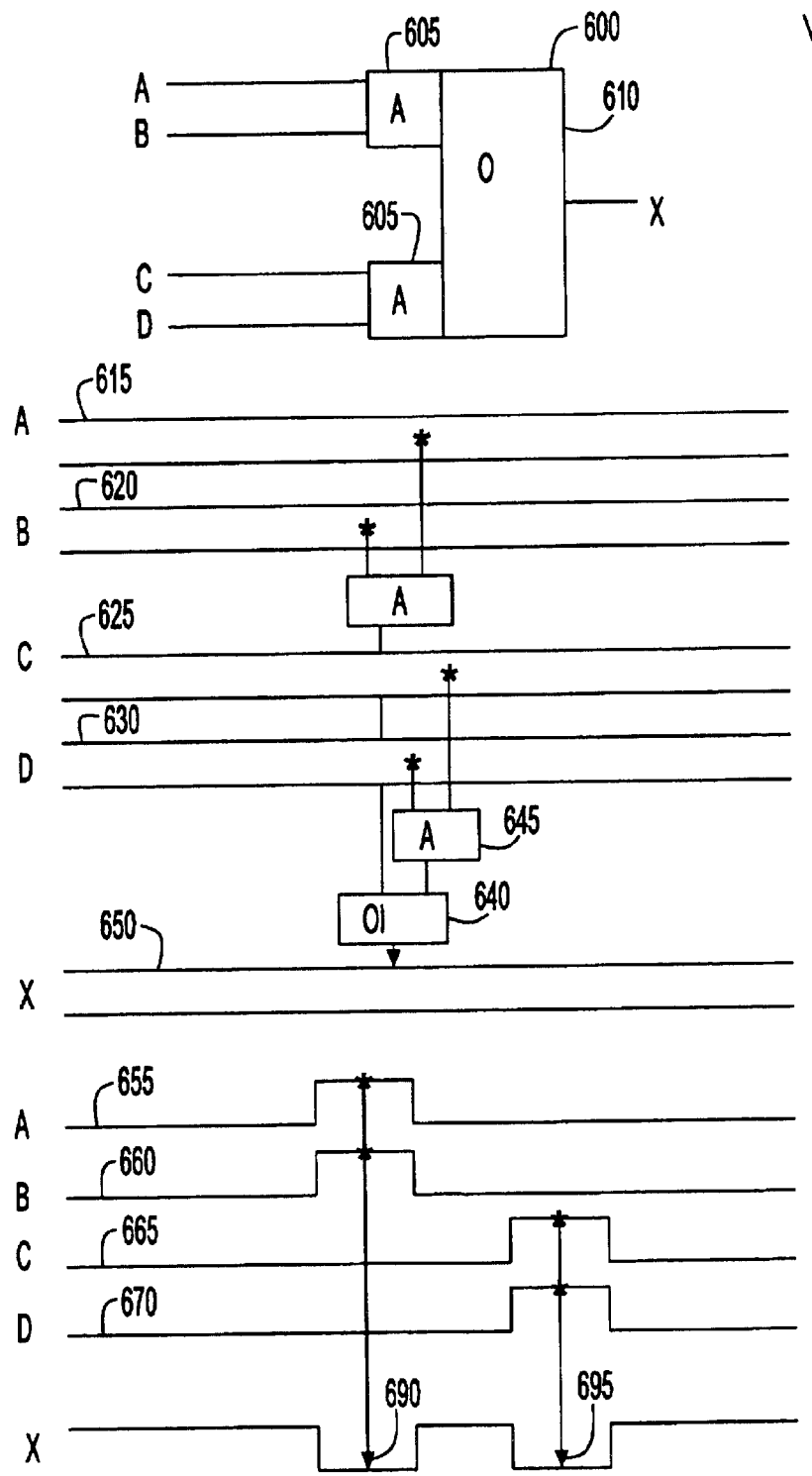
FIG. 6 illustrates the logic entry of the operator according to the method of the preferred embodiment.

FIGS. 4, 5, and 6 are other examples of logic entry which illustrate as with the example of FIG. 1 the method and system of the preferred embodiment. FIG. 4 shows both the structural description and the timing based logic entry for a read function of a Synchronous Memory. In the structural logic entry (450) the memory is represented with a rectangle (455) having one input signal, the address noted ADDR signal (470) and one output signal, the read data noted RD_DATA signal (475). One latch for the input signal (460) and one latch (465) are also indicated. The corresponding timing diagram (400) shows one bit signal for the clock always sequencing the timing diagram. Then two bus signals are illustrated with two time lines, ADDR time line (410) and RD_DATA time line (420). The read operation is indicated as a function RD, noted in a rectangle (440). The timing diagram shows that the input ADDR signal is entered at a certain clock cycle (430) and the output signal is output two cycles after (445) because this is the cycles required for the read operation in the Synchronous memory. This characteristic of the logic entry is not shown in the structural logic entry (450).

FIG. 5 shows both the structural description and the timing based logic entry for a write function of an Asynchronous Memory. In the structural logic entry (550), the memory is represented with a rectangle (555) having three input signals, the address bus signal noted ADDR signal (560), the write data bus signal, noted WR_DATA (570) and the write enable bit signal noted WE (575). The clock bit signal is not represented in the figure but is always part of the diagram for sequencing the other signals. The timing based logic entry (500) of the same write function in an asynchronous memory shows much more. The three time lines representing the three signals are ADDR time line for the address signal (510), the WE time line (520) for the write enable signal and the WR_DATA time line (530) for the write data signal. The graphic of timelines shows that the write enable, WE, is a single bit signal, as the other two time lines ADDR and WR_DATA are more than one bit signals. The write function is represented by the WR operation in a rectangle (540). The timing diagram shows that the write operation is performed during active write enable signal (525). The arrows having their origin from write data signal (535) and write enable signal (525) show that the output of the write operation triggers the address signal (545).

FIG. 6 shows both the structural description and the timing based logic entry for the operator. The clock signal is not represented to make the figure clearer but this signal is part of this timing diagram. The structural logic entry (600) shows the four input signals A, B, C and D. It shows also that signals A and B enter an AND gate and C and D are also input signals of a second AND gate. The gates are represented with rectangles (605). The two signals issuing from the two AND gates are inputs to an NOR gate (610) represented by a rectangle. The result of NOR gate is a unique signal X. In FIG. 6, the same logic has two representations in a time based logic entry depending if the A, B, C and D signals are multiple bit or single bit. The multiple bit signal time based logic entry shows the four non single bit signals A, B, C, D by four time lines 615, 620, 625 and 630. The two AND operators are represented by two rectangles (635 and 645). The A and B inputs to the first AND operator (635) are illustrated by two arrows starting from A and B and going to the AND element (635). The unique output from AND element (635) goes to the NOR combinational function (640). Similarly, the C and D inputs to the second AND operator (645) are illustrated by two arrows starting from A and B and going to the AND element (635). The unique output from AND element (645) goes to the NOR combinational function (640). The output from the NOR combinational function forms the X multiple bit signal (650). All the operations are performed in the same cycle.

The single signal time based logic entry shows the four single bit signals A, B, C, D by four time lines 655, 660, 665 and 670. The AND and NOR operations are much simpler to represent in the case of single bit signals as AND is when the two input signals (A and B or C and D) are active simultaneously, this giving the resulting down X single bit signal. This is shown in the timing diagram by two arrows one starting from the rising A and B time lines and joining the down X time line (690) and one starting from the active C and D signal time lines and joining the down X time line (695). Once again, the time diagrams are able to show more details showing the interrelations between signals.

Figure 10:
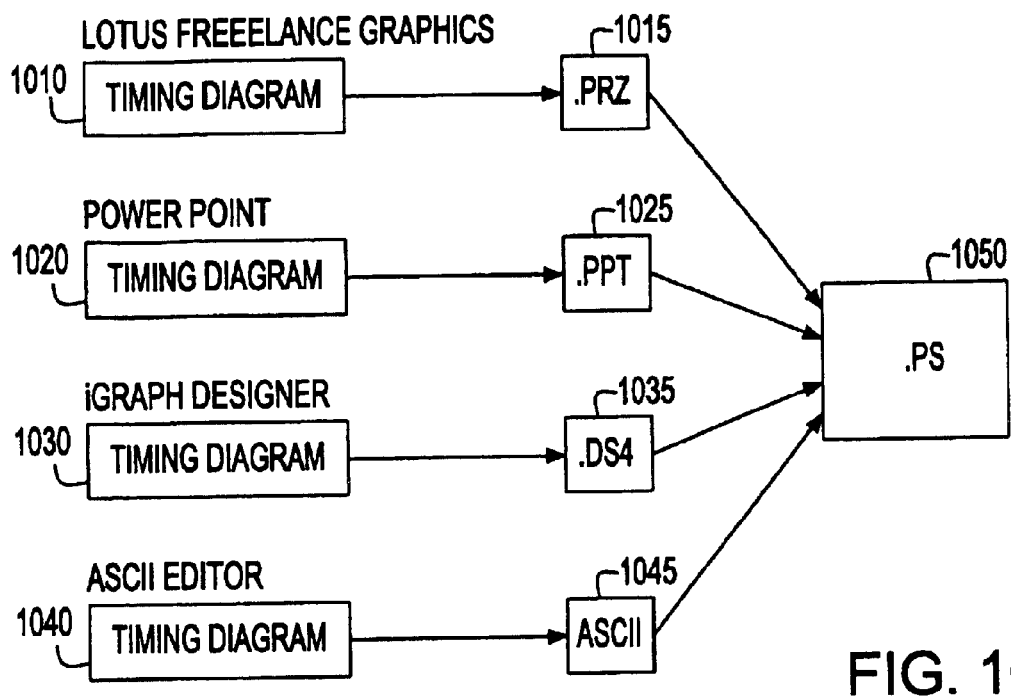
FIG. 10 shows the use of an intermediate standardized graphic format to create the logic entry according to the preferred embodiment.

FIG. 10 shows the use of an intermediate standardized graphic format to create the logic entry according to the preferred embodiment. According to the first step (700) of the method of the preferred embodiment as illustrated in the flow chart of FIG. 7, the timing diagram is created using a graphical tool. FIG. 10 illustrates that when the timing diagram is created using Lotus Freelance Graphics tool (1010), the output is a ".PRZ" file (1015). When the graphic tool is Microsoft PowerPoint (1020), the output is a ".PPT" file (1025). When the graphic tool is iGraph Designer (1030), the output file is a ".DS4" file (1035). The simplest graphic tool is an ASCII editor (1040), the output file being an ASCII file (1045). All these output files containing the coded graphic objects are specific to the tool used. To obtain an HDL description file from these specific graphical files, a different translation program must be written for each of these specific files. The format of these graphical files will change also with the evolution of the graphical tool. If a new version of a graphical tool is used to create a timing diagram, this may imply a change of the output file. Consequently, the translation program to HDL description file must be changed according to this new version. In order to avoid creating so many specific translation programs, in the preferred embodiment the graphical files are translated into a very stable and generalized graphical format, namely PostScript. Originally, PostScript is a language interpreted by printers for printing any combination of text and drawings. Its syntax allows flexible manipulations of different symbols, such as text fonts, lines, polygons, circles etc . . . For these reasons it is a format very widely deployed, all operating system can print any application output to a PostScript file. The "print to file" command, available in the device driver available in any operating system allows to translate any graphical file (1015, 1025, 1035, 1045) into a ".PS" PostScript format file (1050).

As illustrated in FIG. 10, the logic designer can use any graphical tool and produce a resulting PostScript format file containing the timing diagram (1050). The actual translation to final logic entry starts from this PostScript input format of the timing diagram.

Figure 11:
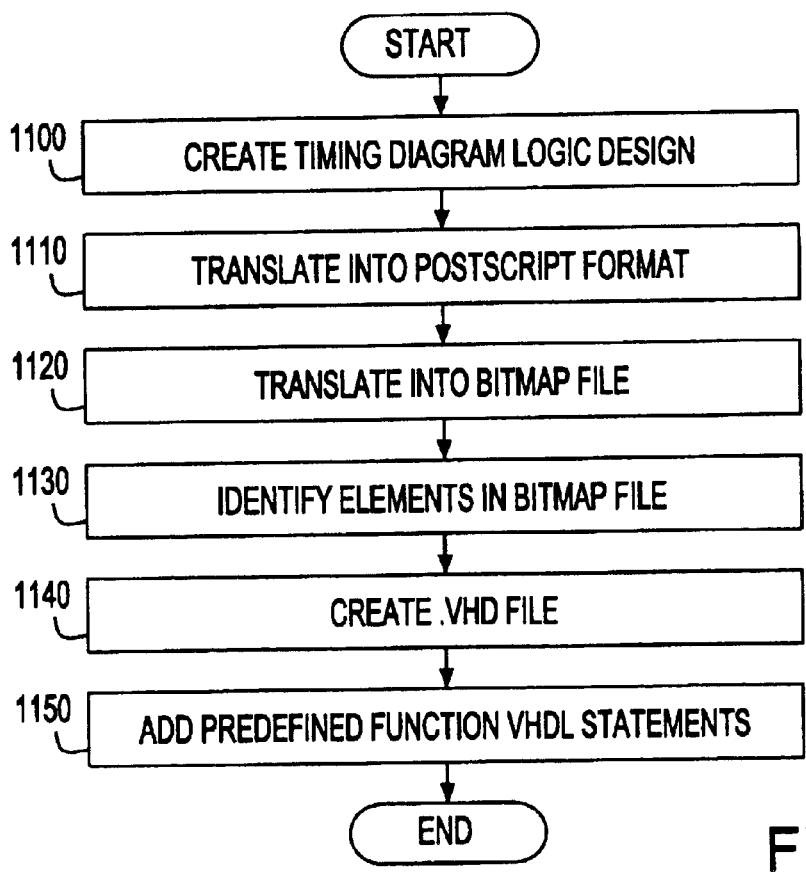
FIG. 11 is the flow chart of the method to create a timing diagram and to translate it into a VHDL description file using an intermediate standardized graphic format according to the preferred embodiment.

FIG. 11 shows the complete flow chart of the method of the preferred embodiment for creating timing diagrams with any kind of graphical editor and translating it into an HDL description file using PostScript as an intermediate graphical format.

The first step accomplished by the designer is for creating the timing diagram representing the logic design through a graphical editor (1100). The second step consists of translating the graphical output file resulting from the preceding step into a PostScript format file (1110). This is performed via a "print to file" command executed by the PostScript device driver of the operating system where the graphical editor is operating. A ".PS" file is created by this driver, it contains the translation of the graphical file into PostScript format. The next step is for translating the ".PS" file into a bitmap file (1120). As a matter of fact, even if the PostScript statements in the ".PS" are well known and well documented, they are usually not used as is by printing tools, they are first translated into bitmap files. A bitmap file is a point per point description of a page to be printed. The bitmap files are stored temporarily in memory by the printing programs for a next translation, they can also be stored in a disk file. This translation step from ".PS" to bitmap is a common operation, well known in the art as many programs are available today to convert PostScript format files into bitmaps. These programs are called "Raster Image Processor" (RIP) software. For instance, the Adobe PostScript RIPs from Adobe Systems Incorporated documented at the Internet address "www.adobe.com". The next step is for performing all the phases of translation as taught in reference with FIG. 7, in the three phase translation process (710) for identifying all the elements of the designed object (1130). The signal names are first identified (720), then the signal assignments and processes are then identified, finally the input and output signals are identified. The bitmap files are easy to read each pixel in a page is represented, each element in the timing diagram being read point per point.

The next step is for creating a description file with the HDL statements (1140), for instance VHDL statements, corresponding to the elements identified in the bitmap file. Optionally, an additional step (1150) is executed, if pre-defined functions are used in the design, the corresponding HDL statements being read in an HDL library and added where it is necessary in the previously created HDL statements.

Figure 12:
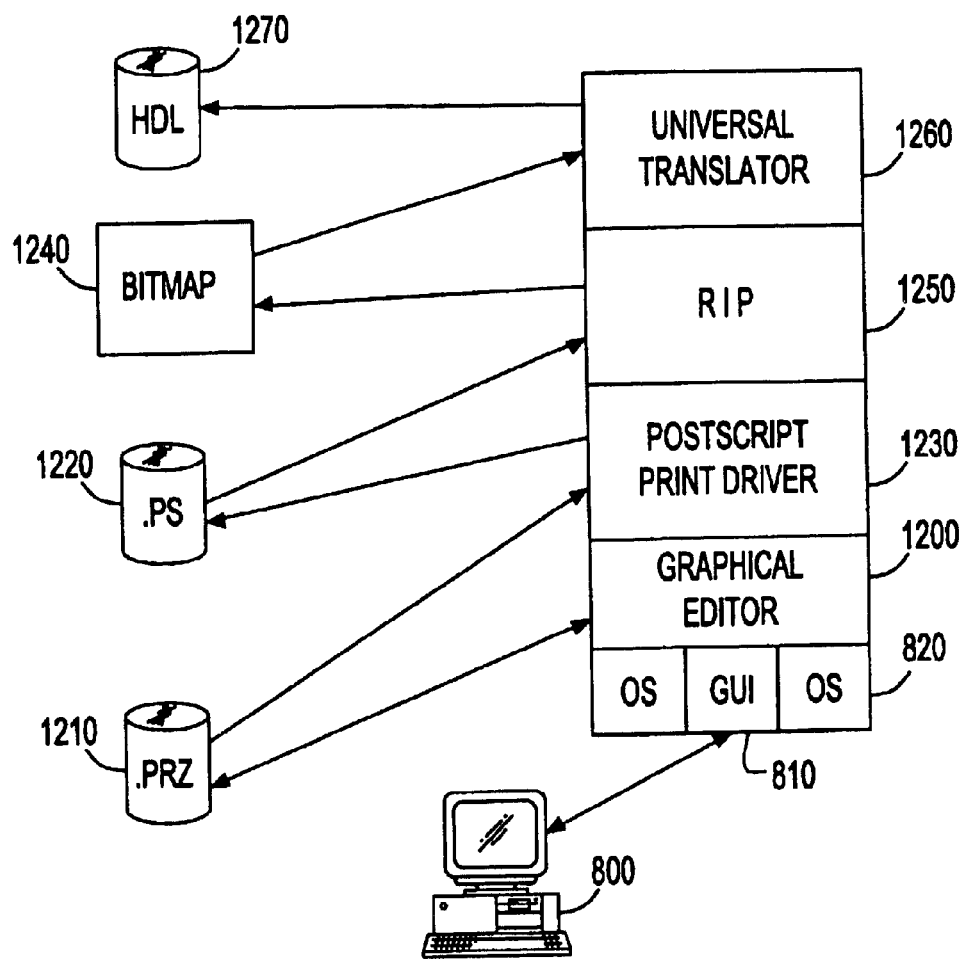
FIG. 12 illustrates the computing environment to operate the method to create a timing diagram and to translate it into a VHDL description file using an intermediate standardized graphic format according to the preferred embodiment.

FIG. 12 illustrates the computing environment to operate the method to create a timing diagram and to translate it into a VHDL description file using PostScript as an intermediate standardized graphic format according to the preferred embodiment. Similarly with the system environment described in FIG. 8, in the computer (800) is executed the operating system (820) which includes a graphical user interface (GUI) (810). A graphical editor, such as Lotus Freelance Graphics (1200) uses this GUI to interface with the designer. The designer displays graphical timing diagrams on the screen while conceiving the logic. The result of the step using Lotus Freelance Graphics is a ".PRZ" file (1210) containing a graphical description of the timing diagram representing the logic. The ".PRZ" file is then translated into a PostScript format file, a ".PS" file (1220). This one step operation is performed by the PostScript device driver (1230) which is a program always available with the operating system of the computer. Then, in a next step the ".PS" file is translated into a bitmap memory area (1240) or a bitmap file by the RIP program (1250) operating on the computer. The pages coded in the bitmap file are read point per point by the program so called universal translator (1260). This program will translate the elements of the logic design identified in the bitmap file into HDL statements that it writes in a HDL description file (1270) which could be a VHDL description file. The translator is called "universal" because with the method of the preferred embodiment, it can be used for any kind of graphical file (1210).

Not represented in FIG. 12, the computer environment may optionally include an HDL library comprising ".HDL" description files corresponding to predefined functions if used in the design. The universal translator (1260), when creating the HDL statements in the description file, will use the ".HDL" files corresponding to the predefined functions and update the just created ".HDL" description file with them wherever it is necessary, in order to obtain the final HDL description file (1270).

What is claimed is:

1. A method for creating on a computer a timing based representation of an integrated circuit using a graphical editor operating on the computer, said method comprising the steps of:

drawing with a single line at least one time line representing at least one clock of the circuit;

drawing other bit signal time lines;

drawing direct arrows going from one of the signal time to at least one other signal time line to describe signal assignments of the circuit;

drawing function symbols and writing function names identifying functions of the circuit;

drawing arrows connecting signals through function symbols for conditional signal assignments;

writing signal names;

translating a graphical editor output file into a PostScript format file;

translating the PostScript format file into a bitmap file;

reading the bitmap file;

identifying the signal names;

identifying the direct arrows and the signals of the signal assignments;

identifying the functions, the arrows and the signals of the conditional signal assignments;

identifying input and output signals of the circuit, and creating an HDL file and writing HDL statements corresponding to elements and behavior identified in the previous identifying steps.

2. The method of claim 1 wherein the other bit signals are either single bit or multiple bit signals and wherein the multiple bit signal time lines have a different drawing style than the single bit signal time lines.

3. The method of claim 1 further comprising the following steps of:

identifying in the graphical editor output file function names corresponding to predefined functions;

looking for HDL statements of said predefined functions in a library of predefined function HDL files;

inserting in the created HDL file the HDL statements read in said predefined function HDL files.

4. The method of claim 1 wherein the graphical editor is an ASCII editor.

5. The method of claim 1 wherein the HDL file is a VHDL file and wherein the HDL statements are VHDL statements.

6. A computer program product comprising programming code instructions for executing the steps of the method according to claim 1 wherein said instructions are executable on a computer.

7. A system comprising means adapted for carrying out the method according to claim 1.

8. A method for creating on a computer a timing based representation of an integrated circuit using a graphical editor operating on the computer, said method comprising the step of:

drawing with a single line at least one time line representing at least one clock of the circuit;

drawing other bit signal time lines;

drawing direct arrows going from one of the drawn signal time lines to at least one other drawn signal time line to describe the signal assignments of the circuit;

drawing function symbols and writing function names identifying function of the circuit;

drawing arrows connecting signals through function symbols for conditional signal assignments;

writing signal names;

reading a graphical editor output file;

identifying the signal names;

identifying the direct arrows and the signals of the signal assignments;

identifying the functions, the arrows and the signals of the conditional signal assignments;

identifying input and output signals of the circuit, and creating an HDL file and writing HDL statements corresponding to the elements and behavior identified in the previous identifying steps.

9. The method of claim 8 further comprising the following steps of:

identifying in the graphical editor output file function names corresponding to predefined functions;

looking for HDL statements of said predefined functions in a library of predefined function HDL files;

inserting in the created HDL file the HDL statements read in said predefined function HDL files.

10. A method for creating on a computer a timing base representation of an integrated circuit using a graphical editor operating on the computer, said method comprising the step of:

drawing with a single line at leas one time line representing at least one clock of the circuit;

drawing other bit signal time lines;

drawing direct arrows going from one of the drawn signal time lines to at least one other drawn signal time line to describe the signal assignments of the circuit;

drawing function symbols and writing function names identifying function of the circuit;

drawing arrows connecting signals through function symbols for conditional signal assignments, and writing signal names, wherein the graphical editor is an ASCII editor.

* * * * *